United States Patent
Tsai

(10) Patent No.: US 10,893,631 B2
(45) Date of Patent: Jan. 12, 2021

(54) LIQUID COOLING DEVICE COMBINED ON GRAPHICS CARD

(71) Applicant: COOLER MASTER CO., LTD., New Taipei (TW)

(72) Inventor: Shui-Fa Tsai, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 0 days.

(21) Appl. No.: 16/231,761

(22) Filed: Dec. 24, 2018

(65) Prior Publication Data

US 2019/0208665 A1 Jul. 4, 2019

Related U.S. Application Data

(60) Provisional application No. 62/612,825, filed on Jan. 2, 2018.

(51) Int. Cl.
| | | |
|---|---|---|
| *H05K 7/20* | (2006.01) | |
| *G06F 1/20* | (2006.01) | |
| *F28F 3/02* | (2006.01) | |

(52) U.S. Cl.
CPC .......... *H05K 7/20272* (2013.01); *F28F 3/02* (2013.01); *H05K 7/20254* (2013.01); *H05K 7/20263* (2013.01)

(58) Field of Classification Search
CPC ... H05K 2201/064; H05K 2201/10409; H05K 2201/10121; H05K 2201/10325; H01L 23/473; H01L 23/42; H01L 23/44; H01L 23/46; H01L 23/4334; H01L 23/49568; F28F 3/02

USPC ......... 361/699, 701–703, 761, 764; 257/714, 257/722

See application file for complete search history.

(56) References Cited

U.S. PATENT DOCUMENTS

| | | | | |
|---|---|---|---|---|
| 4,680,445 | A * | 7/1987 | Ogawa | A61M 5/44 165/46 |
| 6,853,554 | B2 * | 2/2005 | Bash | H05K 7/20772 165/185 |
| 8,619,425 | B2 * | 12/2013 | Campbell | H05K 7/20809 165/80.4 |
| 9,318,406 | B2 * | 4/2016 | Prautzsch | H05K 1/0203 |
| 9,677,820 | B2 * | 6/2017 | Tsai | F28F 1/00 |
| 10,048,008 | B1 * | 8/2018 | Mounioloux | F28D 1/05391 |
| 2002/0030721 | A1 * | 3/2002 | Asakawa | B41J 2/14048 347/65 |

(Continued)

*Primary Examiner* — Zachary Pape
*Assistant Examiner* — Amir A Jalali

(57) ABSTRACT

A liquid cooling device is provided with a heat dissipating assembly and a pump assembly. The heat dissipating assembly has a plate and a cover. The plate has a connecting surface and a sinking surface opposite each other. The connecting surface has a connecting portion configured to attach to a heat source. The sinking surface has multiple fins corresponding to the connecting portion in location. The cover is mounted on the sinking surface. The pump assembly juxtaposes the heat dissipating assembly. A graphics card is also provided. The graphics card has a graphics card main body and the liquid cooling device. Therefore, functions of the conventional water block and the conventional pump are integrated in one liquid cooling device, which reducing an amount of connecting parts and the probability of leakage of the working fluid.

18 Claims, 15 Drawing Sheets

(56) References Cited

U.S. PATENT DOCUMENTS

| | | | |
|---|---|---|---|
| 2005/0098880 A1* | 5/2005 | Torkington | H01L 23/44 257/714 |
| 2005/0151243 A1* | 7/2005 | Mok | H01L 23/42 257/707 |
| 2006/0081980 A1* | 4/2006 | Fernandez | H01L 23/13 257/723 |
| 2006/0289683 A1* | 12/2006 | Olsson | B05C 5/027 239/565 |
| 2009/0101316 A1* | 4/2009 | Han | F28D 15/00 165/104.33 |
| 2010/0039767 A1* | 2/2010 | Katada | F28F 3/12 361/679.53 |
| 2013/0021752 A1* | 1/2013 | Campbell | H05K 7/203 361/700 |
| 2017/0023317 A1* | 1/2017 | Zhang | F28F 9/26 |
| 2017/0339802 A1* | 11/2017 | Pan | F28D 15/00 |
| 2019/0090384 A1* | 3/2019 | Xiao | H05K 7/20263 |
| 2019/0239388 A1* | 8/2019 | Tsai | H01L 23/473 |
| 2019/0267312 A1* | 8/2019 | Koller | H01L 23/49575 |

* cited by examiner

LIQUID COOLING DEVICE COMBINED ON GRAPHICS CARD

CROSS-REFERENCE TO RELATED APPLICATIONS

This application is based upon and claims priority under 35 U.S.C. 119 from U.S. Provisional Application No. 62/612,825 filed on Jan. 2, 2018, which is hereby specifically incorporated herein by this reference thereto.

BACKGROUND OF THE INVENTION

1. Field of the Invention

The present invention relates to a liquid cooling device, especially to a liquid cooling device for a graphics card.

2. Description of the Prior Arts

A conventional liquid cooling system comprises a pump, a reserve tank, a water block, a heat exchanger (i.e. heater core or radiator), circling pipes connecting aforesaid components, and a working fluid circling in aforesaid components. The water block is attached to a heat source and used for removing heat generated by the heat source. When the working fluid flows through the water block, the heat absorbed by the water block is transferred to the working fluid. Then when the working fluid flows through the heat exchanger, the heat transferred to the working fluid is sunk by the heat exchanger and thus the working fluid is cooled. After that, the working fluid flows through the water block and keeps removing the heat transferred to the heat source.

One of the common problems about the conventional liquid cooling system is the working fluid may be leaked from a gap formed between any connected two components, e.g. a gap may be formed between an end of one of the circling pipes and the water block. Because the heat source may be an electronic component and the working fluid may be water, if the working fluid is leaked, the electronic component may be broken. One cause of the leak of the working fluid is that the circling pipes cannot sustain high temperature, and thus the circling pipes may become brittle and split itself. Another cause of the leak the working fluid is that the circling pipes are not fixed completely on another component.

Another common problem about the conventional liquid cooling system is the entire volume is large. Precisely, the pump of the liquid cooling system occupies large space, so the entire volume of the liquid cooling system is hard to be reduced.

To overcome the shortcomings, the present invention provides a liquid cooling device combined on a graphics card to mitigate or obviate the aforementioned problems.

SUMMARY OF THE INVENTION

The main objective of the present invention is to provide a liquid cooling device and a graphics card with said liquid cooling device that have less seams at connecting portions.

The liquid cooling device is configured to attach to a heat source, GPU, and comprises a heat dissipating assembly and a pump assembly. The heat dissipating assembly forms a first flow path and comprises a plate and a cover. The plate comprises a connecting surface and a sinking surface. The connecting surface comprises a connecting portion configured to attach to the heat source. The sinking surface is opposite the connecting surface and comprises a plurality of fins correspond to the connecting portion in location. The cover is securely mounted on the sinking surface. The first flow path is formed between the plate and the cover and passes through intervals among the fins. The pump assembly is securely mounted on the heat dissipating assembly and juxtaposes the heat dissipating assembly. The pump assembly forms a second flow path communicating with the first flow path.

A graphics card comprises a graphics card main body and an aforementioned liquid cooling device. The graphics card main body comprises a graphics processing unit, i.e. GPU. The liquid cooling device is securely mounted on the graphics card main body, and the connecting portion of the liquid cooling device is attached to the graphics processing unit.

Functions of the conventional water block and the conventional pump are integrated as the liquid cooling device of the present invention, which reduces an amount of connecting parts and thereby a probability of leakage of the working fluid is also reduced. Furthermore, with the pump assembly, the liquid cooling device of the present invention does not need to be connected to an extra pump, which reduces a volume of a liquid cooling system equipped with the liquid cooling device of the present invention. In addition, with the pump assembly, a thickness of the liquid cooling device of the present invention is decreased enough and thereby the liquid cooling device with a graphics card main body can be mounted in a slot of the computer.

DETAILED DESCRIPTION OF THE PREFERRED EMBODIMENTS

Figure 1:
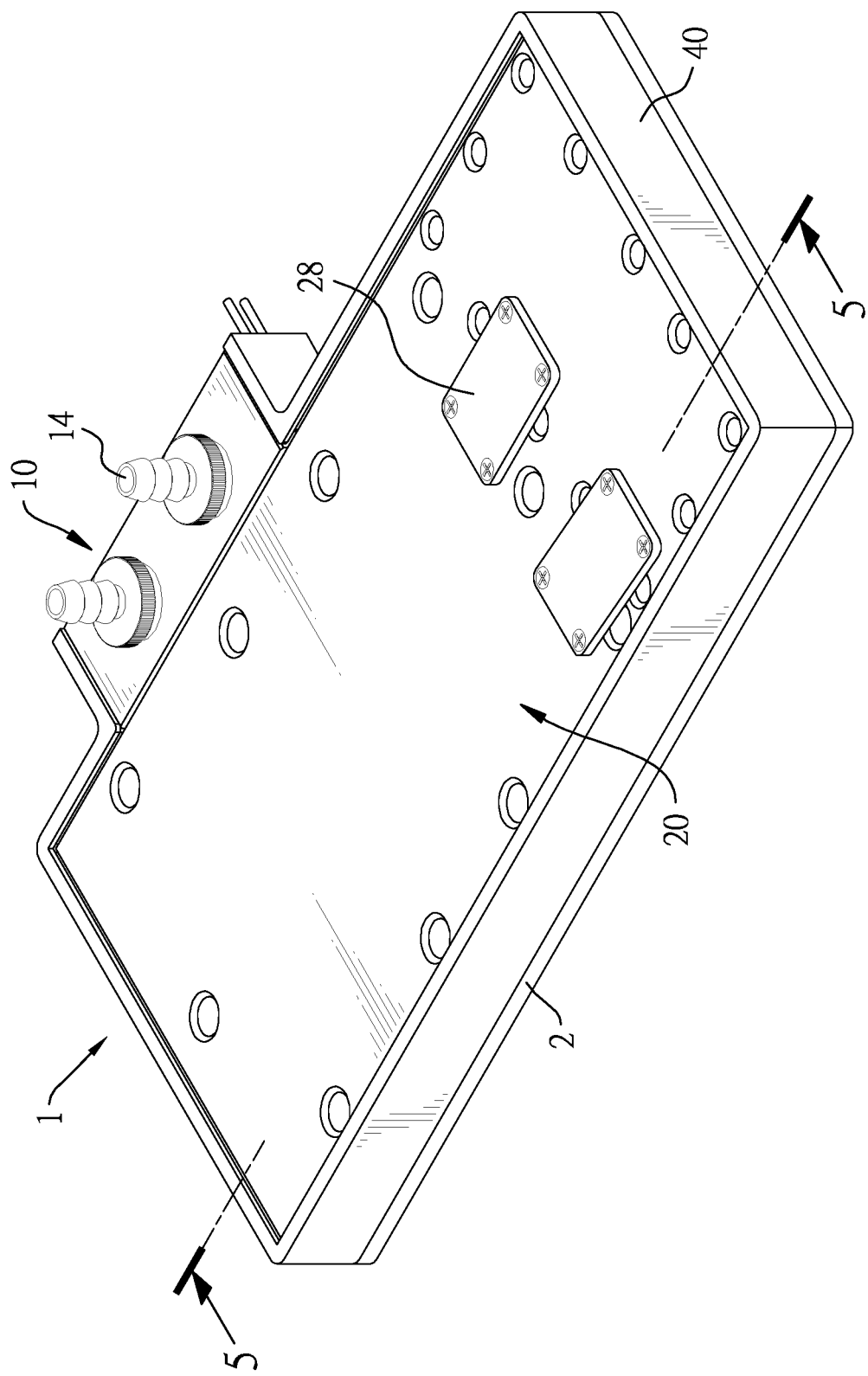
FIG. 1 is a perspective view of a liquid cooling device in accordance with a first embodiment of the present invention.
Figure 2:
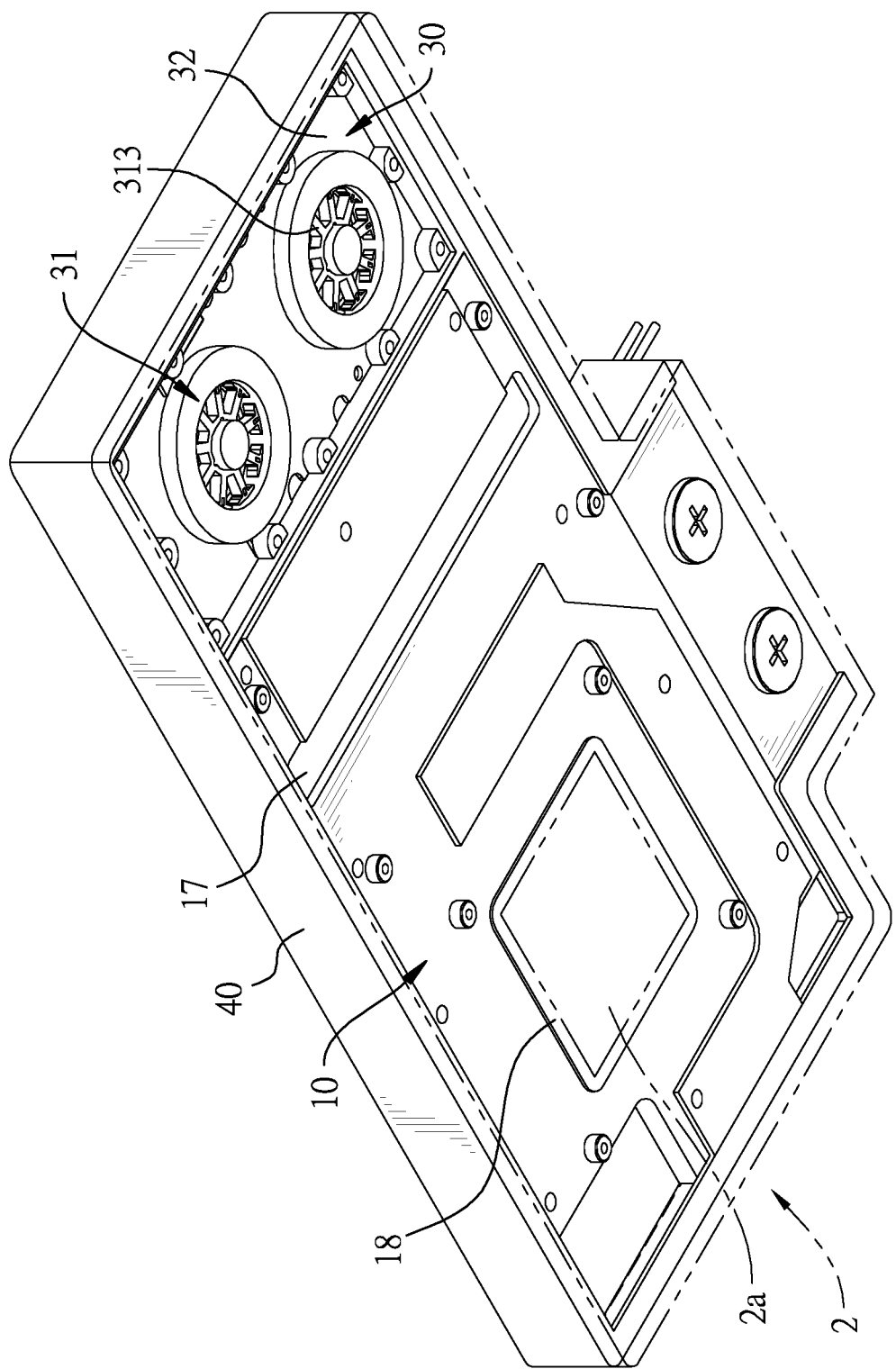
FIG. 2 is another perspective view of the liquid cooling device in FIG. 1.

With reference to FIGS. 1 and 2, a liquid cooling device combined on a graphics card in accordance with the present invention is provided and includes a liquid cooling device 1 and a graphics card main body 2. The liquid cooling device 1 comprises a heat dissipating assembly including a plate 10 and a cover 20, and a pump assembly 30 mounded abreast the heat dissipating assembly, i.e. the pump assembly 30 juxtaposes the heat dissipating assembly. Precisely, the pump assembly 30 is positioned in an imaginary space that is defined by extending a plate-shape of the heat dissipating assembly, or the pump assembly 30 is positioned in a thickness scope of the heat dissipating assembly. The heat dissipating assembly forms a first flow path between the plate 10 and the cover 20 and the pump assembly 30 forms a second flow path therein, and the first flow path communicates with the second flow path.

The plate 10 may plate-shape metal, and preferably made of a high-thermal-conductivity metal, e.g. copper. The plate 10 forms a connecting surface and a sinking surface opposite each other. The connecting surface may be a lower surface of the plate 10 and be used for connecting with a heat source, e.g. a graphics processing unit 2a of the graphics card main body 2. In this embodiment, the plate 10 comprises a connecting portion 18, and the connecting portion 18 is located on the connecting surface for attaching to the heat source.

Figure 3:
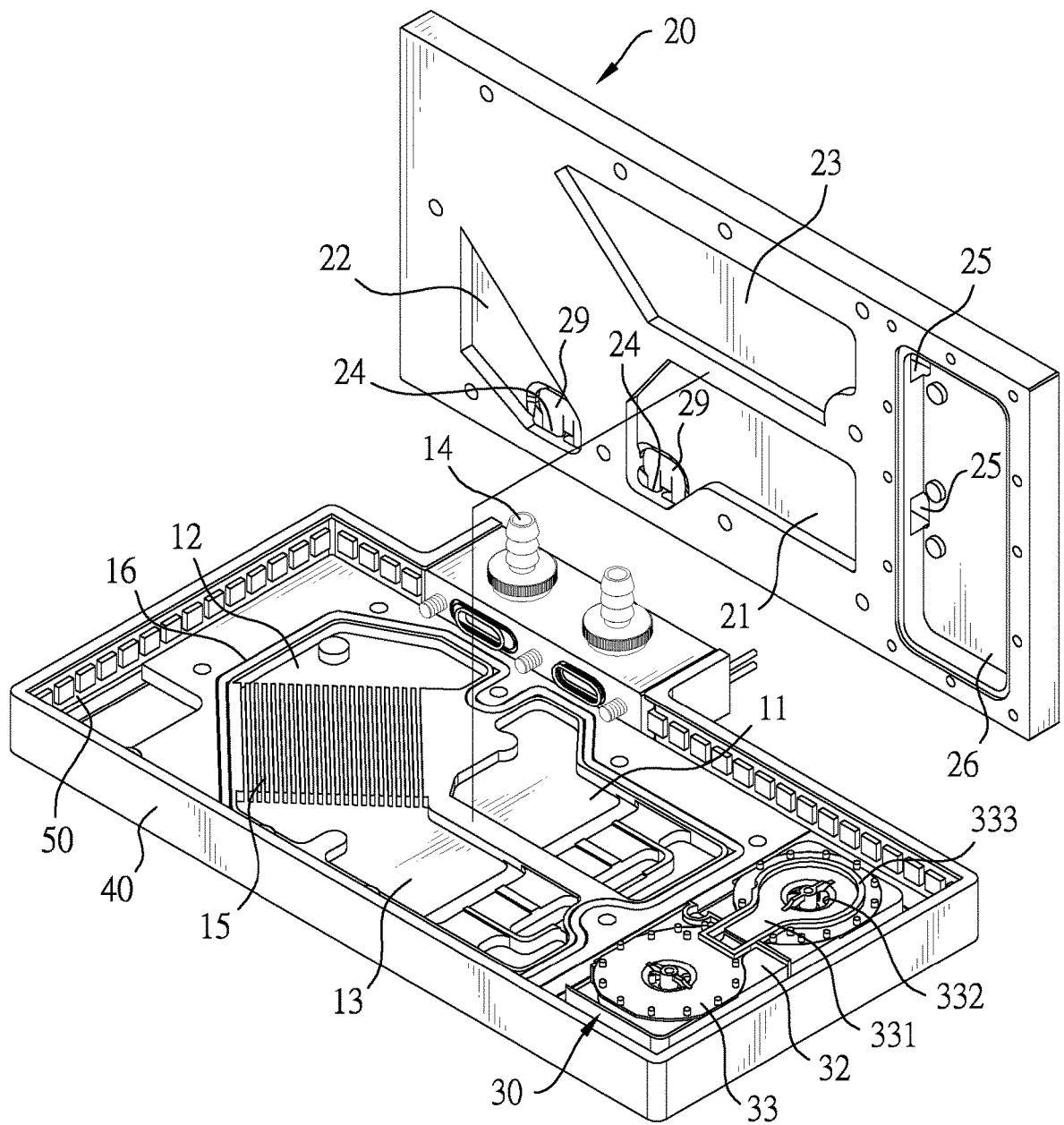
FIG. 3 is an exploded view of the liquid cooling device in FIG. 1.

Please also refer to FIG. 3. The plate 10 further comprises a first cavity 11, a second cavity 12, a third cavity 13, two connecting openings 14, and a plurality of fins 15, and all of the aforesaid elements are located on the sinking surface. The two connecting openings 14 are located on an edge of the plate 10, but, in another embodiment, the connecting openings 14 may be located on different edges of the plate 10. The two connecting openings 14 may respectively communicate with the first cavity 11 and the second cavity 12. Thus, in this embodiment, the two connecting openings 14 are located adjacent to the first cavity 11 and the second cavity 12.

The fins 15 are located between the second cavity 12 and the third cavity 13, and thereby the second cavity 12 and the third cavity 13 of the plate 10 communicate with each other via gaps in the fins 15. A location of the fins 15 is corresponding to a location of the heat source. In other words, the fins 15 are corresponding to the connecting portion 18 in location.

In this embodiment, the plate 10 further comprises an O-ring 16, but it is not limited thereto. The O-ring 16 surrounds the first cavity 11, the second cavity 12, and the third cavity 13.

The cover 20 is mounted on the sinking surface of the plate 10 and forms a first flow path with the plate 10. The cover 20 seals the first cavity 11, the second cavity 12, and the third cavity 13. Precisely, the cover 20 may seal the first cavity 11, the second cavity 12, and the third cavity 13 by abutting the O-ring 16. The cover 20 comprises a fourth cavity 21, a fifth cavity 22, a sixth cavity 23, two communicating holes 24, and two communicating cavities 29. The fourth cavity 21 covers the first cavity 11 and thus a first space is formed by the fourth cavity 21 covering the first cavity 11, the fifth cavity 22 covers the second cavity 12 and thus a second space is formed by the fifth cavity 22 and the second cavity 12, and the sixth cavity 23 covers the third cavity 13 and thus a third space is formed by the sixth cavity 23 covering the third cavity 13. The two communicating holes 24 communicate with the fourth cavity 21 and the sixth cavity 23 respectively. Precisely, one of the communicating cavities 29 is located between and communicates with the fourth cavity 21 and the communicating holes 24 communicating with the fourth cavity 21, and the other communicating cavity 29 is located between and communicates with the fifth cavity 22 and the other communicating hole 24. The communicating cavities 29 are deeper than the fourth cavity 21 and the fifth cavity 22, so that the working fluid flow is capable of flowing across O-ring 16 at the communicating cavities 29.

In this embodiment, the cover 20 further comprises two passages 25 and a pump cavity 26, but it is not limited thereto. The pump cavity 26 communicates with the fourth cavity 21 via one of the passages 25 and communicates with the sixth cavity 23 via the other passage 25. Besides, in this embodiment, the cover 20 is made of a transparent material, but it is not limited thereto. The cover 20 may be made of metal in another embodiment.

Figure 4:
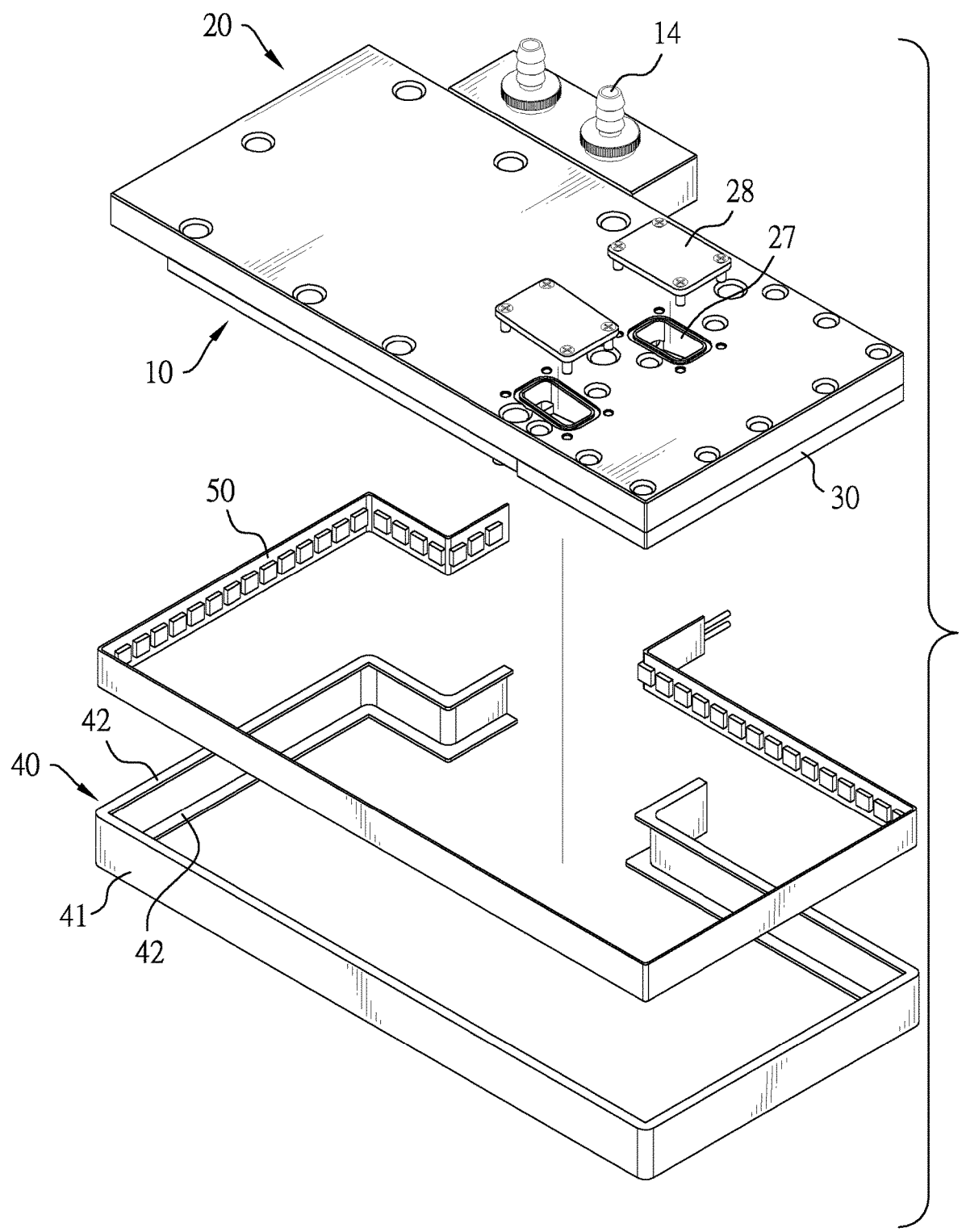
FIG. 4 is another exploded view of the liquid cooling device in FIG. 1.
Figure 5:
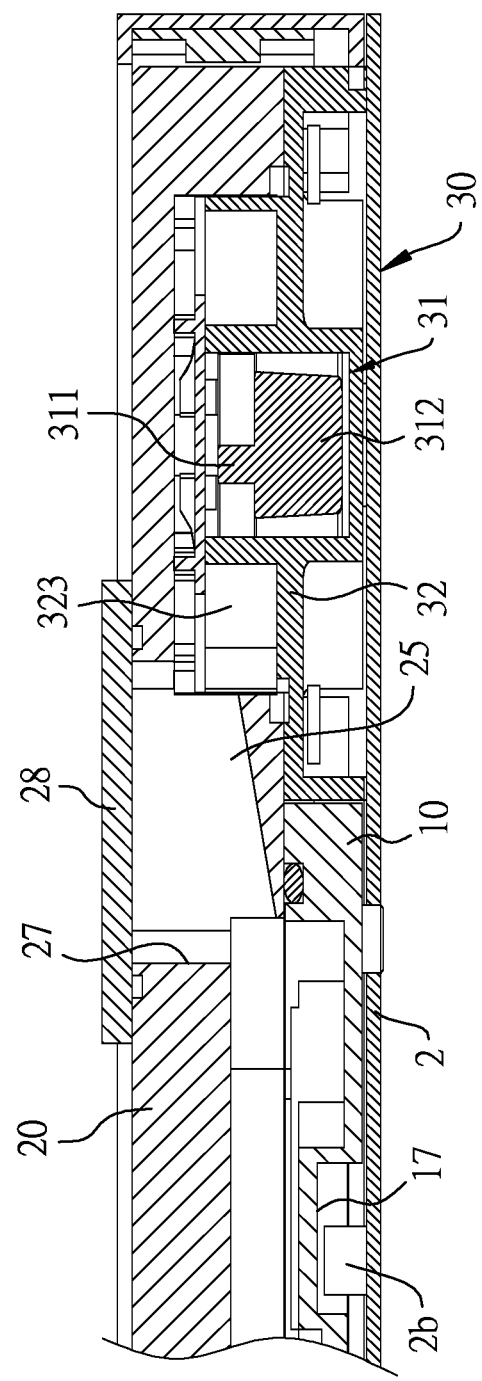
FIG. 5 is a sectional view of the liquid cooling device in FIG. 1 across line 5-5.
Figure 6:
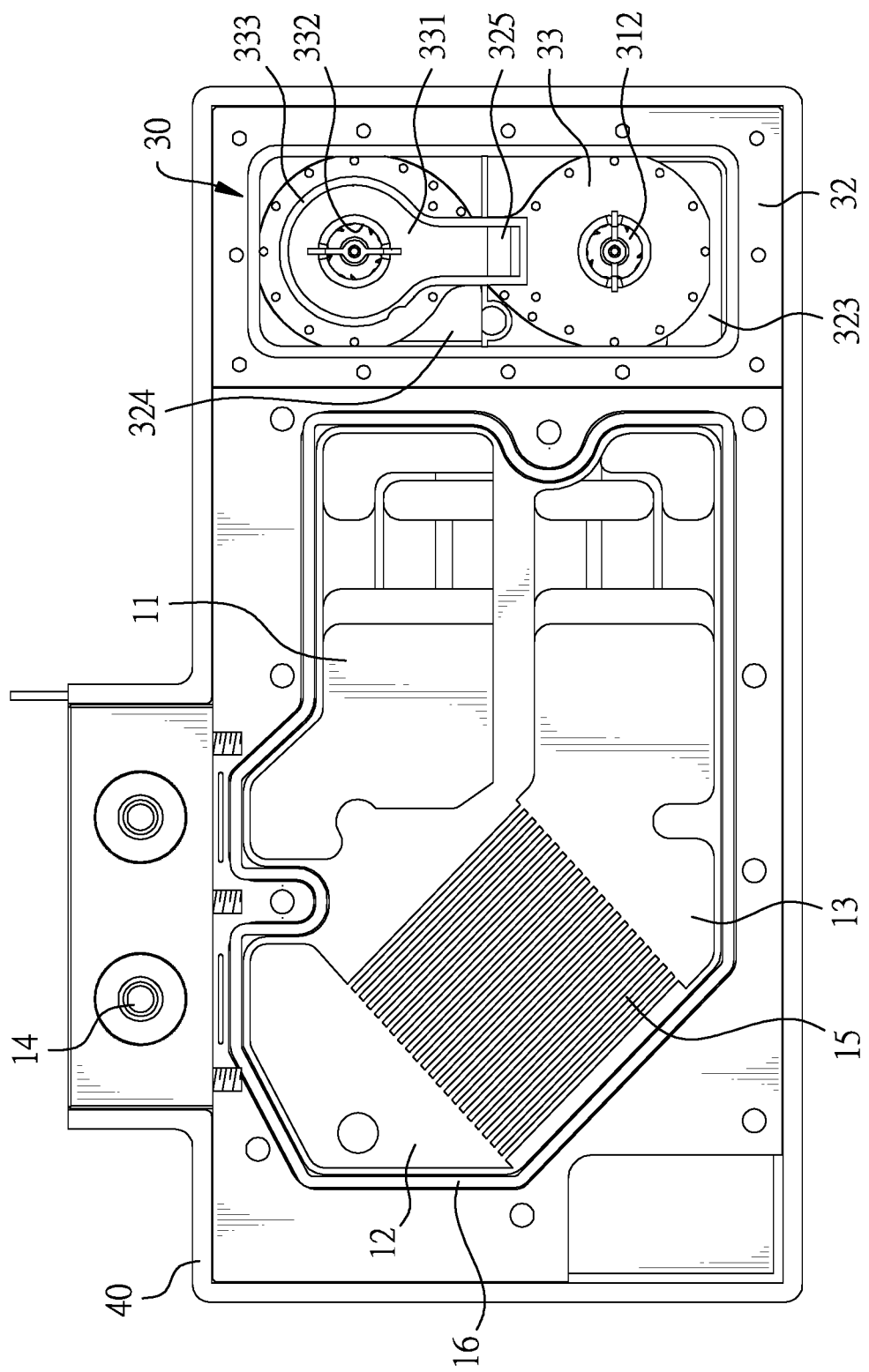
FIG. 6 is a top view of a plate and a pump assembly of the liquid cooling device in FIG. 1.
Figure 7:
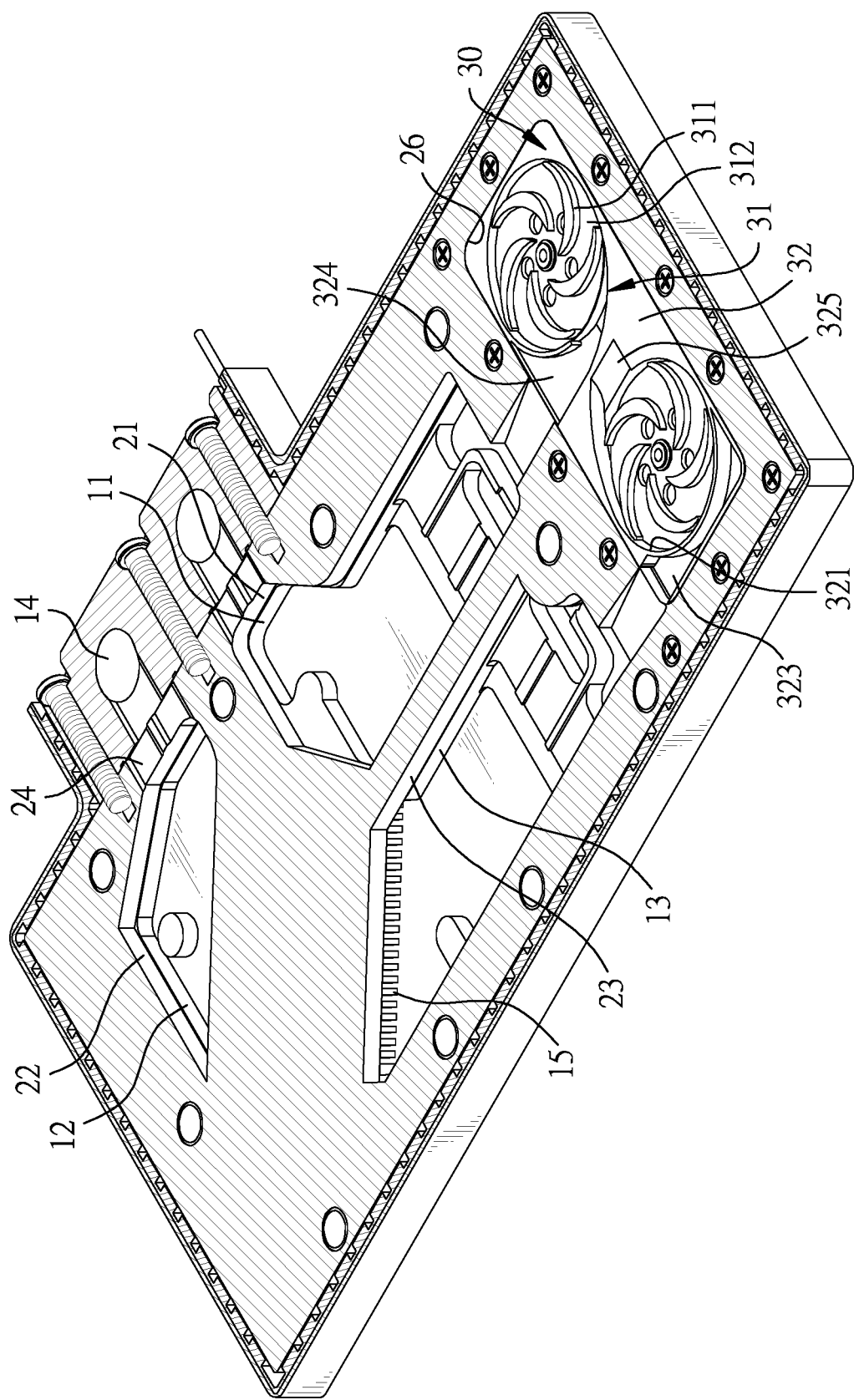
FIG. 7 is a sectional view of the plate and the pump assembly of the liquid cooling device in FIG. 1.
Figure 8:
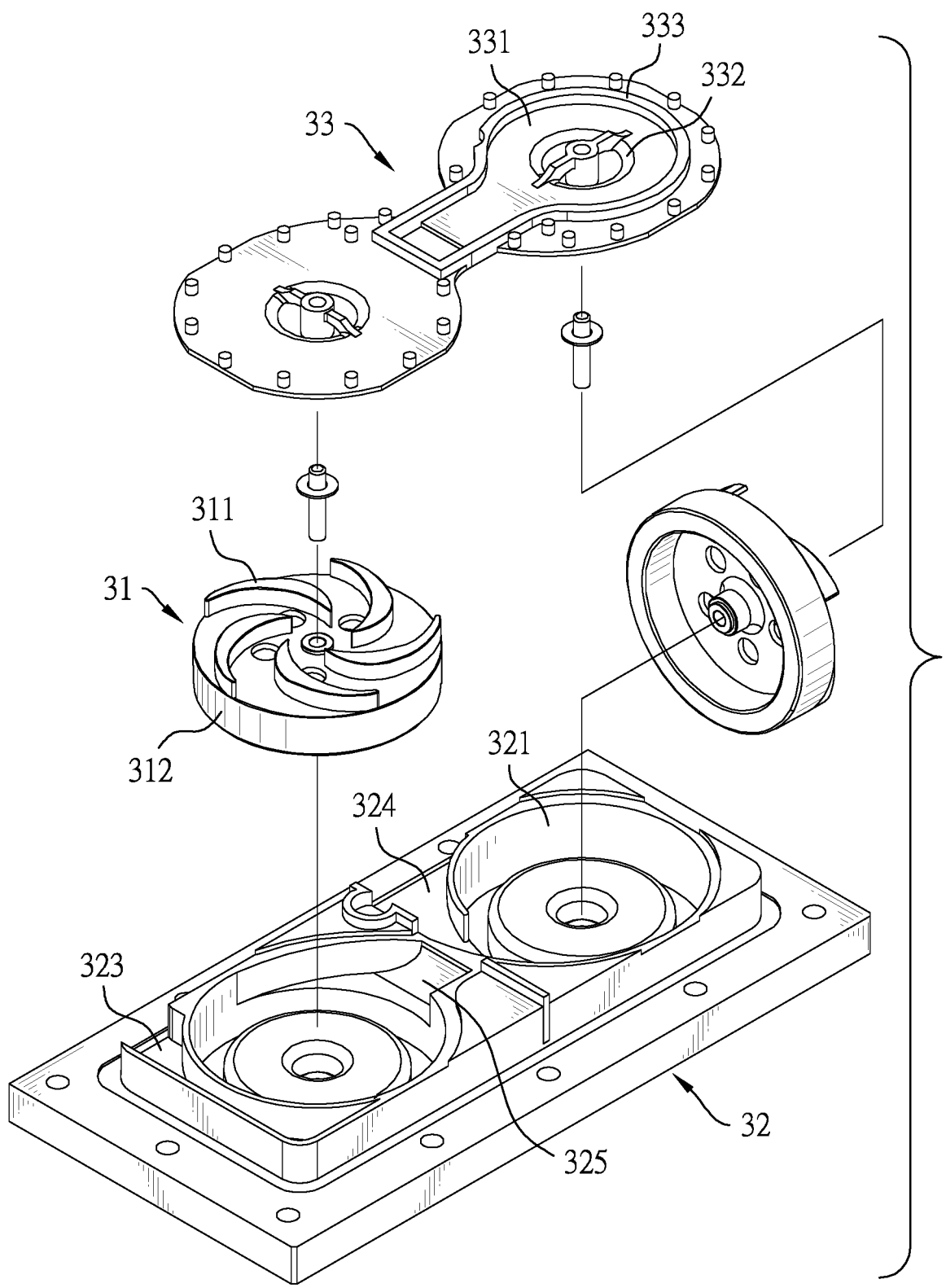
FIG. 8 is an exploded view of the pump assembly in FIG. 1.
Figure 9:
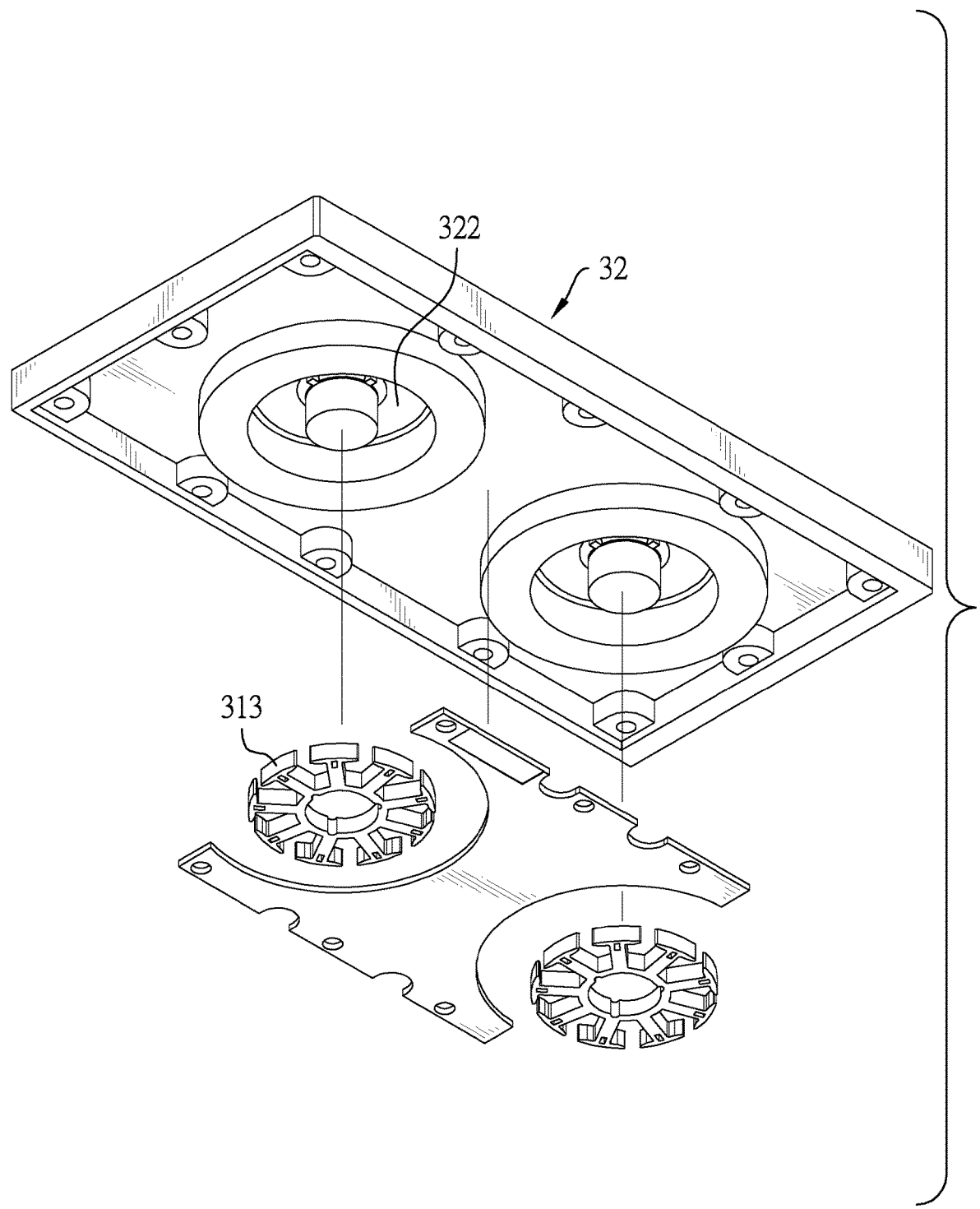
FIG. 9 is another exploded view of the pump assembly in FIG. 1.

Please refer to FIGS. 4 and 5. In this embodiment, the cover 20 further comprises two stepping openings 27 and two pads 28, but the amounts of them are not limited thereto. The stepping openings 27 are formed through the cover 20 and communicate with the passages 25 respectively. The pads 28 respectively seal the stepping openings 27 from the outside. With this structure, a bottom wall of each passage 25 may be higher, and thus a space is enlarged for receiving the pump 31 or electronic components 2b protruding from an upper surface of the graphics card main body 2.

The connecting surface of the plate 10 that is connected to the upper surface of the graphics card main body 2 may form at least one groove 17 for stepping aside from the electronic components 2b. In other words, the electronic components 2b are accommodated in the at least one groove 17.

Please refer to FIGS. 3 and 6 to 9. The pump assembly 30 is mounted in the pump cavity 26 of the cover 20 and thus covered and shielded by the pump cavity 26. The pump assembly 30 comprises at least one pump 31. The at least one pump 31 communicates with the first space formed between the first cavity 11 and the fourth cavity 21 and the third space formed between the third cavity 13 and the sixth cavity 23 via the passages 25 of the cover 20. A number of the at least one pump 31 may be multiple, and, in this embodiment, is two pumps 31. The pumps 31 communicate with each other in serial.

Each one of the pumps 31 comprises a plurality of blades 311 and a driving component 313. Precisely, each one of the pumps 31 comprises a rotating disc 312, and the blades 311 are formed on the rotating disc 312 and arranged radially. The blades 311 and the rotating disc 312 are a rotor of the pump 31. The driving component 313 is capable of driving the rotating disc 312 to rotate. The driving component 313 may be a stator with coils (not shown in the drawings) on the arms of the driving component 313.

Furthermore, in this embodiment, the pump assembly 30 further comprises a pump seat 32 and a lid 33, but it is not limited thereto. The pump seat 32 comprises at least one sealing space 321, at least one accommodating space 322, an inlet 323, and an outlet 324. The at least one sealing space 321 is located on an upper surface of the pump seat 32 and the at least one accommodating space 322 is located on a lower surface of the pump seat 32.

A number of the at least one sealing space 321 and a number of the at least one accommodating space 322 are the same, and both of them are equal to the number of the pumps 31. Therefore, the numbers of the sealing space 321 and the accommodating space 322 are two. Each sealing space 321 corresponds to a respective one of the accommodating spaces 322 in location. The sealing spaces 321 and accommodating spaces 322 are positioned at two opposite surfaces of the pump seat 32. The blades 311 and the rotating disc 312 of each one of the pumps 31 are received in one of the sealing spaces 321 and the driving component 313 of said pump 31 is received in the corresponding accommodating space 322.

The lid 33 is mounted on the pump seat 32 and further on all of the sealing spaces 321 and forms at least one upper space 331 between the lid 33 and the cover 20. Precisely, one surface of the lid 33 is connected to the sealing spaces 321 and another surface of the lid 33 is connected to the upper space 331; i.e., the lid 33 divides a space into the sealing spaces 321 and the upper space 331. Each upper space 331 corresponds to one of the sealing spaces 321 in location. Precisely, each upper space 331 is located above one of the sealing spaces 321. A number of the at least one upper space 331 is equal to the number of the pump 31, so the lid 33 has two upper spaces 331 in this embodiment. The lid 33 comprises at least one entrance hole 332. Each entrance hole 332 communicates with a respective one of the sealing spaces 321 and the upper space 331 above said sealing space 321. A number of the at least one entrance hole 332 is equal to the number of the pump 31, so the lid 33 forms two entrance holes 332 in this embodiment.

The inlet 323 communicates with one of the upper spaces 331, said upper space 331 communicating with one of the sealing space 321. Precisely, an upper portion of each one of the sealing spaces 321 communicates with the upper spaces 331 above said sealing space 321 via the corresponding entrance hole 332, and a side portion of each one of the sealing spaces 321 communicates with another upper space 331, but a side portion of the sealing space 321 at a terminal end communicates with the outlet 324. Therefore, the upper spaces 331 and the sealing spaces 321 are connected and communicated in serial but staggered with each other, i.e. they are arranged in sequence: one of the upper spaces 331, one of the sealing spaces 321, another upper space 331, another sealing spaces 321, still another upper space 331 . . . and the terminal sealing space 321.

The pump seat 32 further comprises at least one connecting channel 325 and the lid 33 further comprises at least one closed wall 333. Each connecting channel 325 is located between each two adjacent ones of the sealing spaces 321 and comprises a first end and a second end. The first end of each connecting channel 325 communicates with one of the sealing spaces 321, and the second end of said connecting channel 325 communicates with the upper space 331 which is above another sealing space 321 adjacent to aforesaid sealing space 321.

The closed wall 333 surrounds one of the entrance holes 332 and the second end of one of the connecting channels 325. The closed wall 333 is configured to isolate the plurality of upper spaces 331. In this embodiment, the upper spaces 331 are surrounded by and formed in the closed wall 333=. In other words, one of the upper spaces 331 is sealed among the closed wall 333, the cover 20, and a lid 33. Therefore, said entrance hole 332 communicates with the second end of said connecting channel 325 via said upper space 331. In the embodiment with more pumps 31, the amounts of the connecting channels 325 and the closed walls 333 are increased correspondingly, and the aforesaid structure is repeated for communicating the connecting channels 325 and the closed walls 333.

The rotating disc 312 of one of the pumps 31 is rotatably mounted in one of the sealing spaces 321, and thus the rotating disc 312 is shielded by the lid 33. The driving component 313 of said pump 31 is mounted in one of the accommodating spaces 322 which corresponds to the sealing space 321 in location.

To make the pump assembly slim, the blades 311, the rotating disc 312, and driving component 313 are made as thin as possible. Besides, instead of arranged above or below the driving component 313, the circuit board is arranged aside the driving component 313.

Please refer to FIGS. 3 and 4. In this embodiment, the liquid cooling device further comprises a case 40 and at least one light strip 50.

The case 40 comprises a frame 41 and a plurality of ribs 42 mounted on inner sides of the frame 41. Precisely, the ribs 42 are mounted on upper edges and lower edges of the inner sides of the frame 41. The plate 10, the cover 20, and the pump assembly 30 are mounted in the frame 41 and on the ribs 42 which are on the lower edges of the frame 41. The light strips 50 are mounted on the inner sides of the frame 41 and between the upper edges and the lower edges.

The light strip 50 may comprise a plurality of light-emitting diode dies. The light strip 50 may be controlled by a computer which the liquid cooling device of the present invention equips on or may be controlled by cell phone app, and thereby the light-emitting diode dies are capable of flashing and providing various lightening effects.

Figure 10:
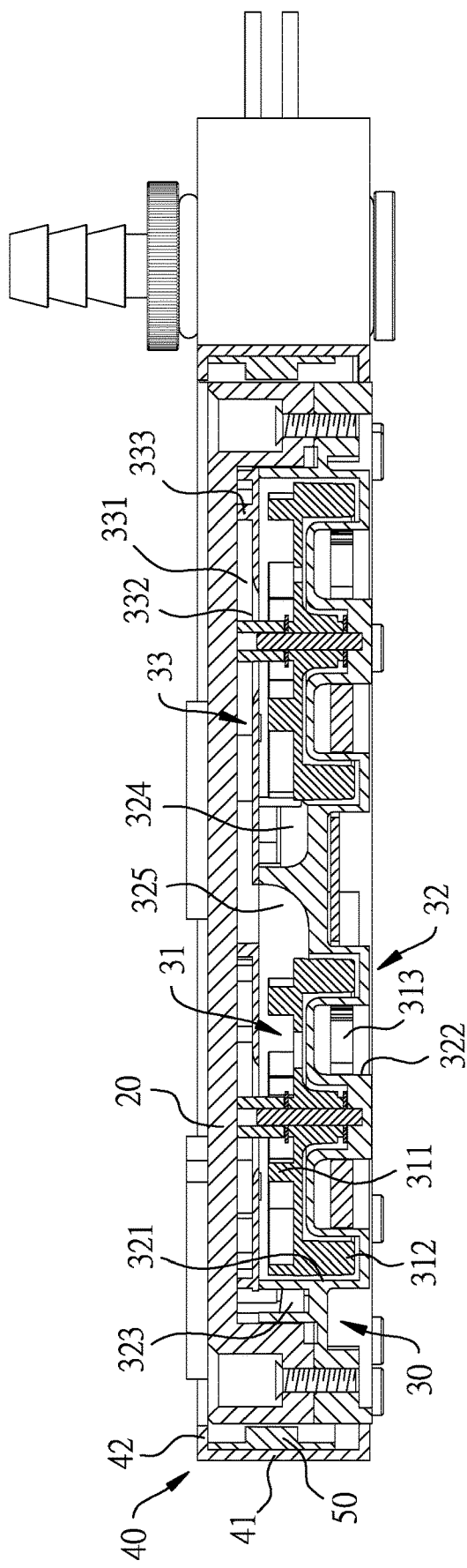
FIG. 10 is a sectional view of the pump assembly in FIG. 1.

Please refer to FIGS. 3, 5, and 10. With aforesaid structures, a working fluid may flow in the liquid cooling device.

In this embodiment, the working fluid flows in sequence through the following course: first, in the first flow path, one of the connecting openings 14 of the plate 10, one of the communicating holes 24, one of the communicating cavities 29, the second space formed of the second cavity 12 and the fifth cavity 22, the gaps in the fins 15, the third space between the third cavity 13 and the sixth cavity 23, and one of the passages 25. Then the working fluid flows into the second flow path in the pump assembly 30. After flowing through the second flow path, the working fluid flows into the remaining first flow path, i.e. the other passage 25, the first space between the first cavity 11 and the fourth cavity 21, the other communicating cavities 29, the other communicating hole 24, and finally the other connecting opening 14 of the plate 10. The two connecting openings 14 of the plate 10 may be connected to two pipes (not shown in the drawings) respectively, and the two pipes are connected to a heat exchanger and a tank. Therefore, the working fluid may circulate in the aforesaid course driven by the pump assembly 30.

When the working fluid flows into the second flow path in the pump assembly 30, the working fluid flows into the upper space 331 which is not closed by the closed wall 333. And then, working fluid flows in sequence through the entrance hole 332 corresponding to the upper space 331, the corresponding sealing space 321, the connecting channel 325, the other upper space 331 closed by the closed wall 333, the other entrance hole 332, the other sealing space 321, and then flows out of the pump assembly 30.

Because the rotating discs 312 of the pumps 31 in the sealing spaces 321 are driven to rotate, the blades 311 on the rotating discs 312 keep providing kinetic energy to the working fluid by exerting centrifugal force on the working fluid. Thus, the working fluid keeps flowing into the sealing spaces 321 from the entrance holes 332 and then flow out of the sealing spaces 321.

In another embodiment, the plate 10 may not comprise connecting openings 14, but comprise a circulating channel communicating with the first cavity 11 and the second cavity 12. Therefore, the working fluid circulates in the liquid cooling device, and thus the liquid cooling device may not be connected to any pipe so that working fluid may not be leaked. In this embodiment, the liquid cooling device may further have other fins for sinking heat outward.

In another embodiment, the cover 20 may not comprise the aforesaid communicating holes 24, so the connecting openings 14 communicate with and are connected to the first cavity 11 and the second cavity 12 directly.

In another embodiment, the cover 20 may not comprise the aforesaid pump cavity 26, so the pump assembly may shield itself and communicate with the passages 25 via itself.

Figure 11:
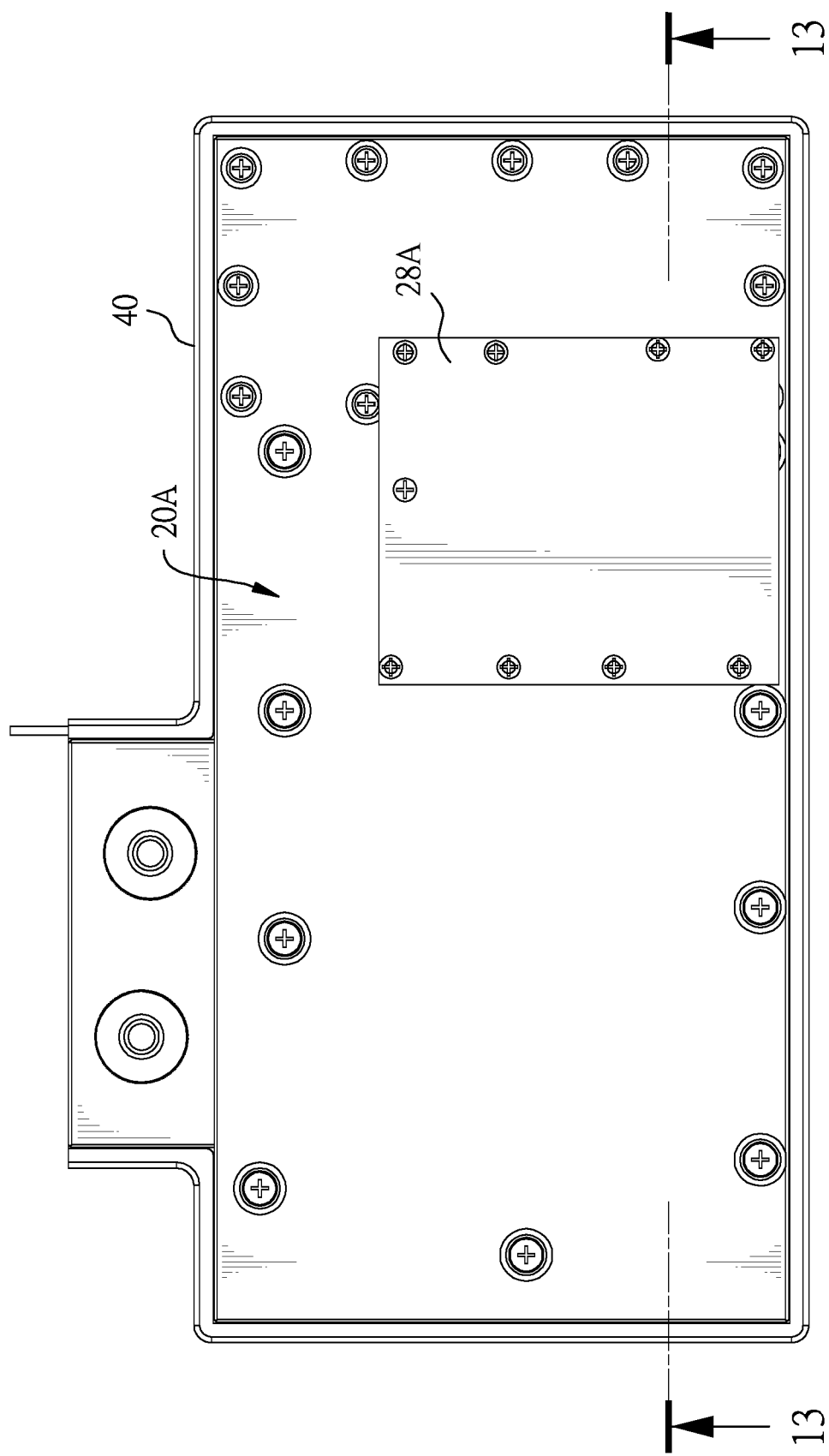
FIG. 11 is a top view of a liquid cooling device in accordance with a second embodiment of the present invention.
Figure 12:
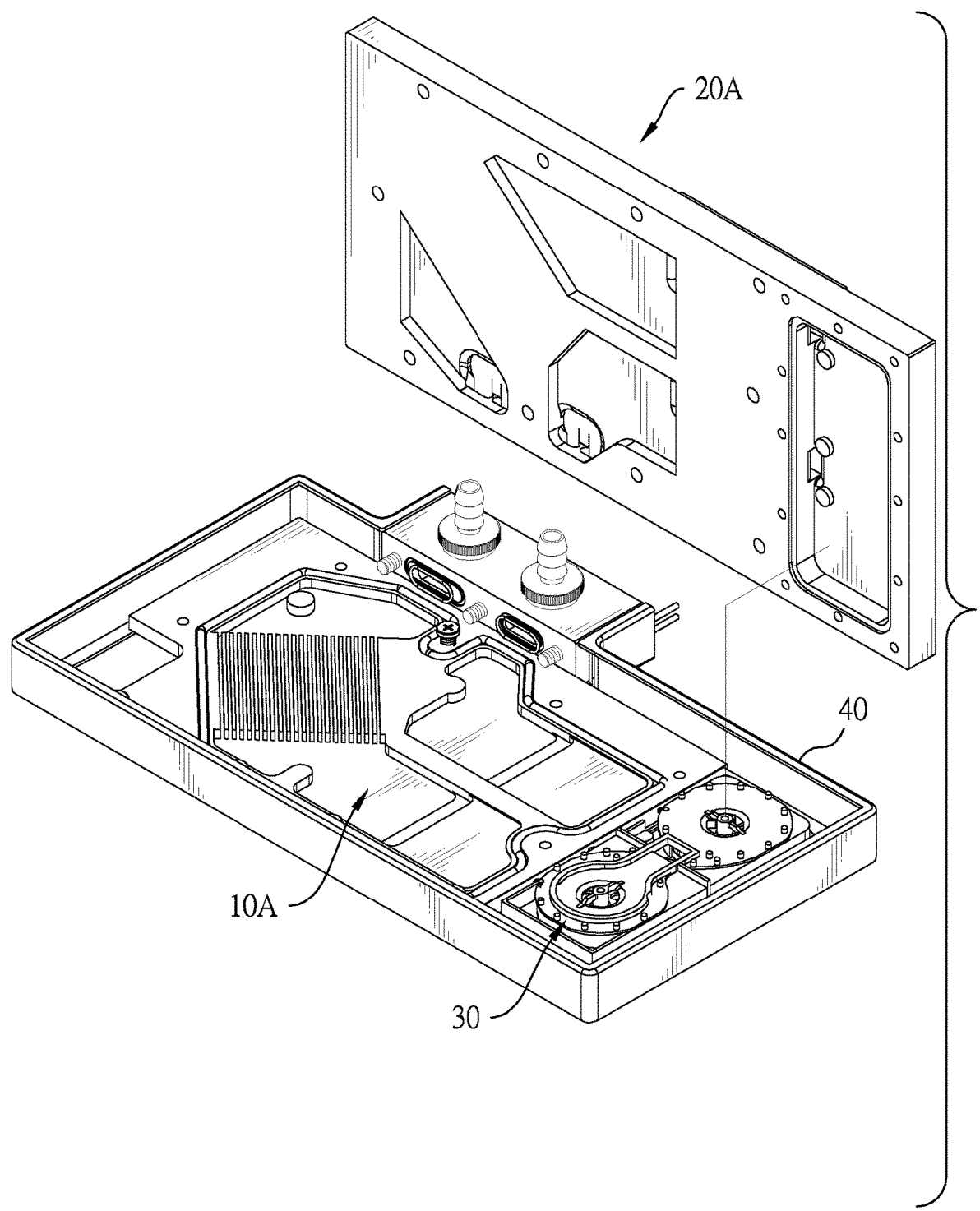
FIG. 12 is an exploded view of the liquid cooling device in FIG. 11.
Figure 13:
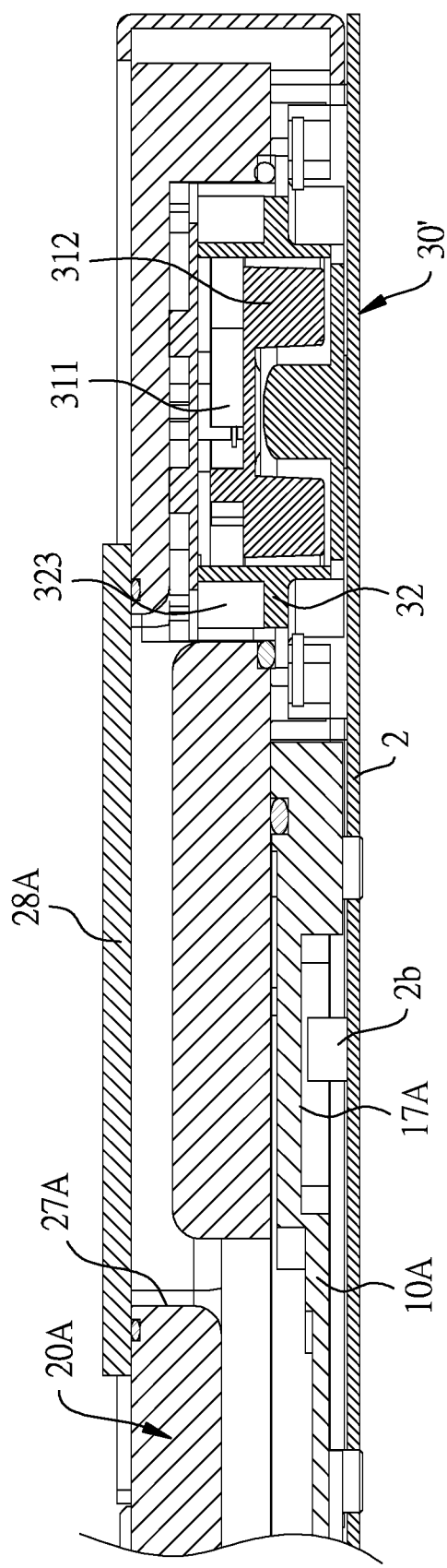
FIG. 13 is a sectional view of the liquid cooling device in FIG. 11 across line 13-13.

Then please refer to FIGS. 11 to 13, which show a second preferred embodiment of the present invention. Technical features of the second preferred embodiment are similar to the first preferred embodiment, but one of the differences is that the cover 20A forms two stepping openings 27A and further comprises one pad 28A for sealing the stepping openings 27A. The stepping openings 27A correspond to the groove 17A of the plate 10A in location.

In the second embodiment, with the at least one groove 17A for stepping aside from electronic components 2b of a graphics card main body 2, a protrusion portion may be formed in an inner surface of the plate 10A and the protrusion portion is corresponding to the groove 17A in location, which causes flowing paths of the working fluid in the liquid cooling device of the present invention to be restricted in width or thickness. To assure the flowing paths are wide or thick enough so that resistances in the flowing paths are low, inner walls of the stepping openings 27A surround said protrusion portion of the plate 10A. In other words, the stepping openings 27A correspond to the groove 17A in location. Therefore, a flowing space is formed between the pad 28A, the stepping openings 27A, and said protrusion portion of the plate 10A.

Figure 14:
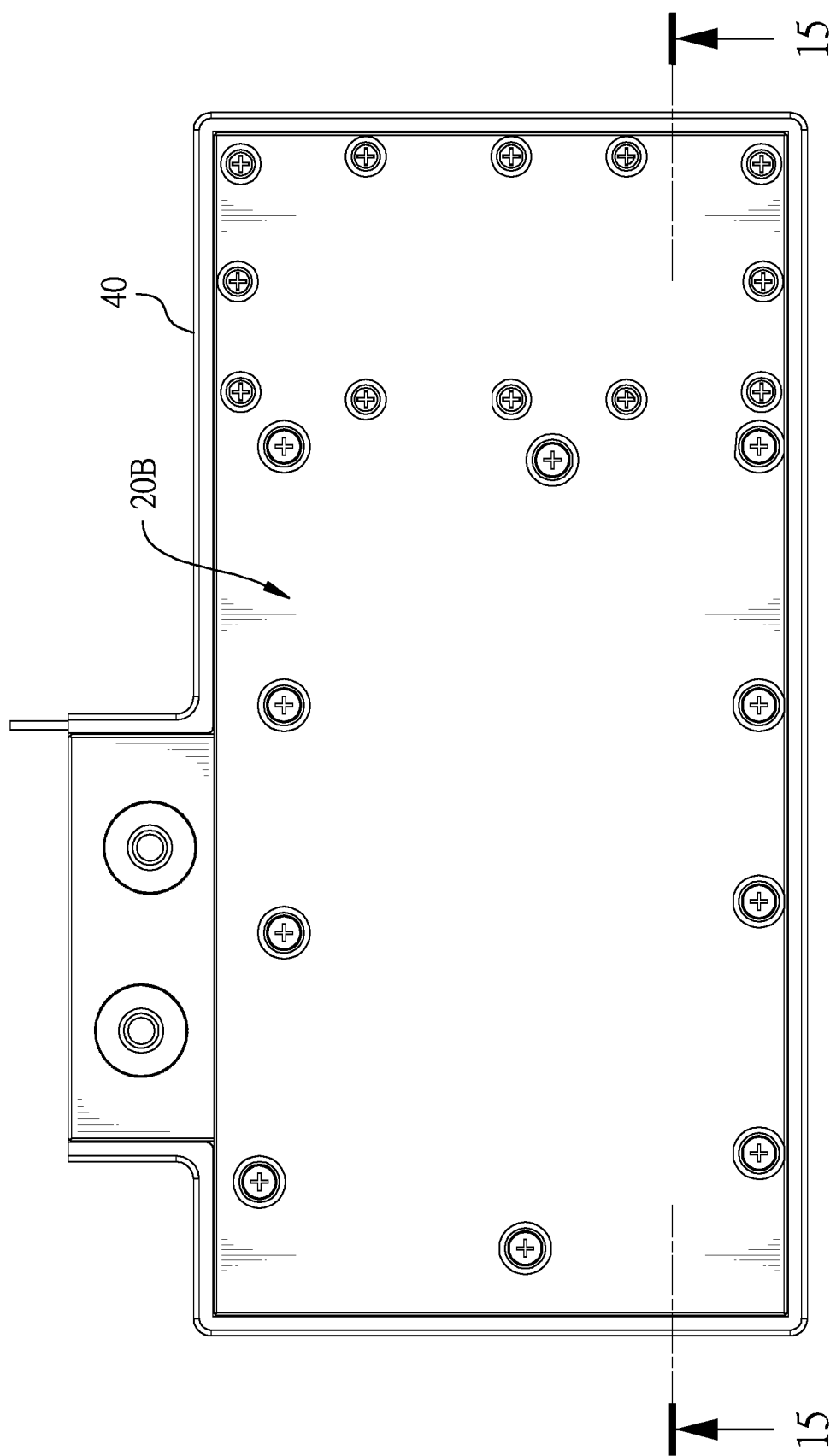
FIG. 14 is a top view of a liquid cooling device in accordance with a third embodiment of the present invention.
Figure 15:
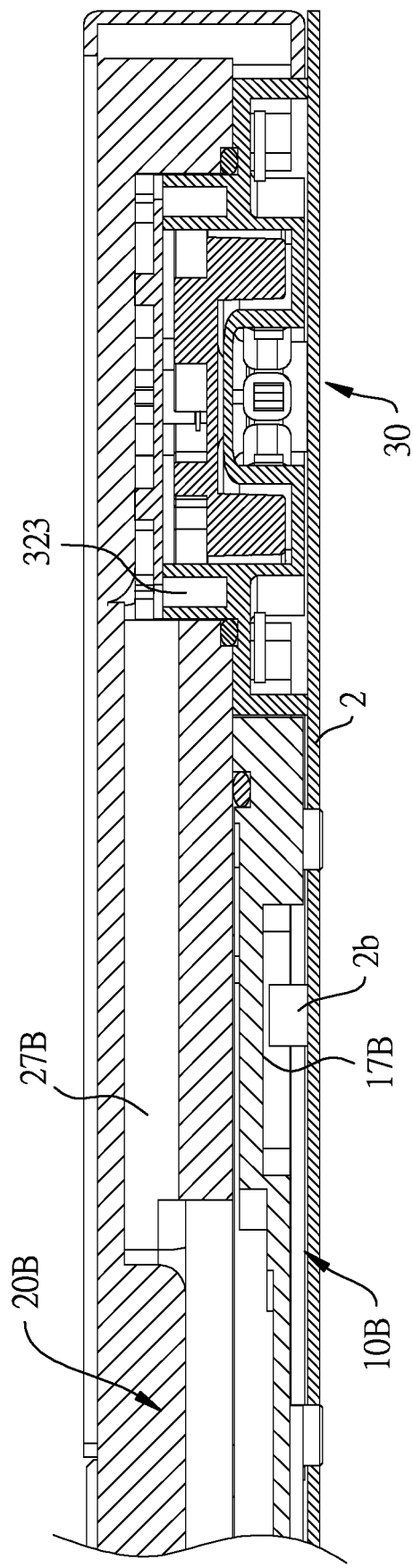
FIG. 15 is a sectional view of the liquid cooling device in FIG. 14 across line 15-15.

Then please refer to FIGS. 14 and 15, which show a third preferred embodiment of the present invention. Technical features of the second preferred embodiment are similar to the aforementioned preferred embodiments and one of the differences is that the protrusion portions of the plate 10B is as thin as possible so the width or thickness of the flowing paths is enough. Therefore, in the third embodiment, the cover 20B does not have any pad as the aforementioned embodiments.

In another embodiment, the liquid cooling device may only have the first cavity 11, the second cavity 12, and the third cavity 13, or, alternatively, may only have the fourth cavity 21, the fifth cavity 22, and the sixth cavity 23. Therefore, the first space, the second space, and the third space may only be formed respectively by the first cavity 11, the second cavity 12, and the third cavity 13, or, alternatively, may only be formed respectively by the fourth cavity 21, the fifth cavity 22, and sixth cavity 23.

Consequently, functions of the conventional water block and the conventional pump are integrated as the liquid cooling device of the present invention, which reduces a number of connecting parts and thereby a probability of leakage of the working fluid is also be reduced. Furthermore, with the pump assembly 30, the liquid cooling device of the present invention does not need to be connected to an extra pump, which reduces a volume of a liquid cooling system equipped with the liquid cooling device of the present invention. In addition, with the pump assembly 30, a thickness of the liquid cooling device of the present invention is decreased enough and thereby the liquid cooling device with a graphics card main body 2 can be mounted in a slot of the computer.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A liquid cooling device, configured for heat source attachment, comprising:
   a heat dissipating assembly forming a first flow path, comprising:
   a plate comprising:
   a connecting surface, comprising:
   a connecting portion, configured for heat source attachment; and
   at least one groove, configured for accommodating electronic components protruding from an upper surface of a main body of a heat source; and
   a sinking surface, opposite the connecting surface, comprising:
   a plurality of fins corresponding to the connecting portion; and
   a protrusion portion corresponding to the at least one groove; and
   a cover, securely mounted on the sinking surface, comprising two separate stepping openings communicating with two separate passages, respectively,
   wherein the two separate stepping openings correspond to the protrusion portion corresponding to the at least one groove, and the protrusion portion and two separate stepping openings form two separate flowing spaces, and
   wherein the first flow path is formed between the plate and the cover, and flows through the intervals of the plurality of fins and two separate flowing spaces of the two separate stepping openings and two separate passages, respectively; and
   a pump assembly forming a second flow path communicating with the first flow path via the two separate passages, respectively, securely mounted on the heat dissipating assembly and juxtaposing the heat dissipating assembly,
   wherein the formation of the two separate flowing spaces increases a vertical height of the first flow path to the two separate passages communicating with the second flow path of the pump assembly, respectively, enlarging a vertical height of the pump assembly for housing of a larger pump assembly and permitting accommodation of the at least one groove, configured for accommodating electronic components protruding from the upper surface of the main body of the heat source.

2. The liquid cooling device as claimed in claim 1, wherein the pump assembly comprises:
   a pump seat forming:
   at least one sealing space on one surface of the pump seat; and
   at least one accommodating space on another surface of the pump seat opposite the at least one sealing space, corresponding to the at least one sealing space,
   wherein an amount of the at least one sealing space is equal to an amount of the at least one accommodating space, whereby the second flow path passes through the at least one sealing space; and
   at least one pump, comprising:
   a rotor, mounted in the at least one sealing space; and a stator, mounted in the at least one accommodating space corresponding to the at least one sealing space, wherein an amount of the at least one pump is equal to the amount of the at least one sealing space.

3. The liquid cooling device as claimed in claim 2, wherein the pump assembly further comprises:
a lid, securely mounted on the pump seat, having one surface connected to the at least one sealing space; and
at least one upper space, connected to another surface of the lid,
wherein an amount of the at least one upper space is equal to the amount of the at least one sealing space and the at least one upper space corresponds to the at least one sealing space, and wherein the at least one upper space communicate with the corresponding at least one sealing space via the lid, whereby the second flow path passes through the at least one upper space.

4. The liquid cooling device as claimed in claim 3, wherein the amount of the at least one sealing space, at least one pump, and at least one upper space is two, respectively, and the lid forms a closed wall, and one of the at least one upper space is formed in the closed wall, and the pump seat forms a connecting channel, and one end of the connecting channel communicates with the at least one upper space formed in the closed wall, and another end of the connecting channel communicates with the at least one sealing space corresponding to the other one of the at least one upper space.

5. The liquid cooling device as claimed in claim 4, wherein the plate further comprises:
a first cavity, communicating with one end of the second flow path, via one of the two separate passages;
a second cavity; and
a third cavity, communicating with the second cavity via the plurality of fins and another end of the second flow path, via another one of the two separate passages,
whereby the first flow path passes through the first cavity, the second cavity, and the third cavity, respectively.

6. The liquid cooling device as claimed in claim 5, wherein the plate further comprises two connecting openings communicating with the first cavity and the second cavity, respectively, and the first flow path passes through the two connecting openings, respectively.

7. The liquid cooling device as claimed in claim 6, wherein the cover comprises:
a fourth cavity covering the first cavity, wherein the fourth cavity and the first cavity form a first space together;
a fifth cavity covering the second cavity, wherein the fifth cavity and the second cavity form a second space together; and
a sixth cavity covering the third cavity wherein the sixth cavity and the third cavity form a third space together,
wherein the fourth cavity, the fifth cavity, and the sixth cavity are formed on a surface of the cover facing the plate.

8. The liquid cooling device as claimed in claim 7, further comprising at least one pad, wherein the least one pad seals the two separate stepping openings from an outside.

9. The liquid cooling device as claimed in claim 8 further comprising a frame, and at least one light strip mounted on an inner side of the frame, wherein the plate, the cover, and the pump assembly are mounted in the frame, and the cover is made from a transparent material.

10. A liquid cooling device system as claimed in claim 6, wherein the cover comprises:
a fourth cavity communicating with one end of the second flow path, via one of the two separate passages;
a fifth cavity; and
a sixth cavity communicating with the fifth cavity via the plurality of fins and another end of the second flow path, via another one of the two separate passage,
whereby the first flow path passes through the fourth cavity, the fifth cavity, and the sixth cavity, and the fourth cavity, the fifth cavity, and the sixth cavity are formed on a surface of the cover facing the plate.

11. The liquid cooling device as claimed in claim 1, wherein the plate further comprises:
a first cavity, communicating with one end of the second flow path, via one of the two separate passages;
a second cavity; and
a third cavity, communicating with the second cavity via the plurality of fins and another end of the second flow path, via another one of the two separate passages,
whereby the first flow path passes through the first cavity, the second cavity, and the third cavity, respectively.

12. The liquid cooling device as claimed in claim 11, wherein the plate further comprises two connecting openings communicating with the first cavity and the second cavity, respectively, and the first flow path passes through the two connecting openings, respectively.

13. The liquid cooling device as claimed in claim 12, wherein the cover comprises:
a fourth cavity covering the first cavity, wherein the fourth cavity and the first cavity form a first space together;
a fifth cavity covering the second cavity, wherein the fifth cavity and the second cavity form a second space together, and
a sixth cavity covering the third cavity, wherein the sixth cavity and the third cavity form a third space together,
wherein the fourth cavity, the fifth cavity, and the sixth cavity are formed on a surface of the cover.

14. The liquid cooling device as claimed in claim 12, wherein the cover comprises:
a fourth cavity, communicating with one end of the second flow path, via one of the two separate passages;
a fifth cavity; and
a sixth cavity, communicating with the fifth cavity via the plurality of fins and another end of the second flow path, via another one of the two separate passages,
whereby the first flow path passes through the fourth cavity, the fifth cavity, and the sixth cavity, and the fourth cavity, the fifth cavity, and the sixth cavity are formed on a surface of the cover facing the plate.

15. The liquid cooling device as claimed in claim 1, further comprising at least one pad, wherein the least one pad seals the two separate stepping openings from an outside.

16. The liquid cooling device as claimed in claim 1 further comprising a frame, and at least one light strip mounted on an inner side of the frame, wherein the plate, the cover, and the pump assembly are mounted in the frame, and the cover is made from a transparent material.

17. A graphics card comprising a graphics card main body, comprising:
a graphics processing unit; and
a liquid cooling device as claimed in claim 1, securely mounted to the graphics card main body,
wherein the connecting portion of the liquid cooling device is attached to the graphics processing unit.

18. The graphics card as claimed in claim 17, wherein the graphics card main body further comprises at least one electronic component, whereby the at least one electronic component is accommodated in the at least one groove.

* * * * *